US006263460B1

United States Patent
Spilo et al.

(10) Patent No.: US 6,263,460 B1
(45) Date of Patent: Jul. 17, 2001

(54) MICROCONTROLLER ARCHITECTURE AND ASSOCIATED METHOD PROVIDING FOR TESTING OF AN ON-CHIP MEMORY DEVICE

(75) Inventors: David A. Spilo; Robert I. Pinkerton, Jr., both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/105,779

(22) Filed: Jun. 28, 1998

(51) Int. Cl.[7] .................................................. G11C 29/00
(52) U.S. Cl. .............................................................. 714/718
(58) Field of Search .................................. 714/718, 719, 714/42; 365/201, 194, 233

(56) References Cited

U.S. PATENT DOCUMENTS

| 5,459,733 | * | 10/1995 | Alapat | 714/718 |
| 5,544,107 | * | 8/1996 | Hill | 714/724 |
| 5,577,236 | * | 11/1996 | Johnson et al. | 713/400 |
| 5,657,283 | * | 8/1997 | Hill | 714/719 |
| 5,764,952 | * | 6/1998 | Hill | 714/718 |
| 5,812,472 | * | 9/1998 | Lawrence | 714/718 |
| 5,938,779 | * | 8/1999 | Preston | 714/718 |

* cited by examiner

Primary Examiner—Albert Decady
Assistant Examiner—Emeka Amanze
(74) Attorney, Agent, or Firm—Kevin L. Daffer; Conley, Rose & Tayon P.C.

(57) ABSTRACT

A microcontroller architecture and an associated method are presented which provide for testing of an "on-chip" memory unit. The microcontroller includes a microcontroller core, the memory unit, a set of input/output (I/O) pads, and an input/output (I/O) pad interface unit, all formed upon a single monolithic semiconductor substrate. The microcontroller core executes instructions and generates data. The memory unit is coupled to the microcontroller core and stores data. The memory unit may include a common static random access memory (SRAM) device having multiple memory cells with load devices permitting static operation. A data latch within the memory unit samples retrieved data and provides the retrieved data to the microcontroller core. The data latch is responsive to a data latch control (DLC) signal produced by the I/O pad interface unit. The I/O pad interface unit receives a signal from one or more members of the set of I/O pads and generates the DLC signal in response to the signal. In a testing mode of the microcontroller, the DLC signal is asserted, and latching of retrieved data occurs on the next transition of a system clock cycle following assertion of the row select signal. Thus in the testing mode, the length of a time period between assertion of the row select signal and the latching of the retrieved data by the data latch is variable and dependent upon the duty cycle of the system clock signal.

25 Claims, 6 Drawing Sheets

DLC Deasserted:

DLC Asserted:

US 6,263,460 B1

MICROCONTROLLER ARCHITECTURE AND ASSOCIATED METHOD PROVIDING FOR TESTING OF AN ON-CHIP MEMORY DEVICE

BACKGROUND OF THE INVENTION

1. Field of the Invention

This invention relates to the manufacture of integrated circuits and more particularly to the manufacture of microcontrollers having "on-chip" memory devices.

2. Description of Related Art

A typical computer system includes a microprocessor secured within a semiconductor device package and connected via signal lines to several separately-packaged support circuits. These support circuits typically include one or more memory devices and circuits which perform an interface function between the microprocessor and the one or more memory devices. A microcontroller is an integrated circuit which incorporates a microprocessor core along with one or more support circuits on the same monolithic semiconductor substrate (i.e., chip). Computer systems which employ microcontrollers may thus be formed using fewer semiconductor devices. Advantages of such systems include lower fabrication costs and higher reliabilities. Various microcontrollers include memory interface circuits and one or more memory devices along with a microprocessor core on the same chip. Microcontrollers find applications in industrial and commercial products including control systems, computer terminals, hand-held communications devices (e.g., cellular telephones), photocopier machines, facsimile machines, and hard disk drives.

FIG. 1 is a block diagram of an exemplary microcontroller 10 including a microcontroller core 12 coupled to an "on-chip" memory device 14 and to several input/output (I/O) pads 16. During manufacture of microcontroller 10, signal lines to be connected to external devices are terminated at I/O pads 16. I/O pads 16 are flat metal contact regions located upon an exposed surface of the chip. Following manufacture, microcontroller 10 is typically secured within a protective semiconductor device package. Each I/O pad is then connected to a terminal (i.e., pin) of the device package by a signal line (i.e., a wire).

Microcontroller core 12 includes a microprocessor core 18 and memory interface circuitry 20. Microprocessor core 18 is configured to execute microprocessor instructions, for example instructions from an x86 instruction set. Memory interface circuitry 20 generates control signals which enable the storing of data within and the retrieving of data from memory device 14 as well as any other memory devices connected to I/O pads 16. Operations within microcontroller 10 are synchronized by a system "clock" signal.

Testing of a memory device such as memory device 14 is typically accomplished by storing data within (i.e., writing to) the memory device, subsequently retrieving the stored data (i.e., reading) the data from the memory device, and comparing the retrieved data to the stored data. If the retrieved data matches the stored data, the memory device is working properly. As on-chip memory device 14 is typically not accessible for testing via I/O pads 16, microcontroller core 12 may be used to test the functionality of memory device 14.

A problem arises when microcontroller core 12 is used to test memory device 14 and the testing requires that the frequency of the clock signal be altered. If the frequency of the clock signal must be increased beyond the operational capability of microcontroller core 12 in order to test the functionality of memory device 14, microcontroller core 12 cannot be used to carry out the testing. This may occur, for example, when memory device 14 is a static random access memory (SRAM) device having memory cells with load devices, and the functionality of the load devices are to be tested.

FIGS. 2–5 will now be used to describe how a typical SRAM memory device operates, and how the functionality of the load devices is commonly tested. FIG. 2 is a block diagram of a typical SRAM device 30. SRAM device 30 includes a memory array 32, a row decoder 34, a column decoder/multiplexer 36, and a sense amplifier 38. Memory array 32 includes multiple memory cells, each of which store a single binary digit (i.e., bit) of data. The memory cells are typically arranged in a two-dimensional array with several rows and columns. Row decoder 34 receives m "row" address signals and produces $2^m$ "row select" signals, one for each row in memory array 32. Each column of memory cells is associated with a complementary (i.e., differential) pair of signal lines referred to as "bit" and "bit'". Column decoder/multiplexer 36 receives n "column" address signals, selecting one of $2^n$ bit and bit' pairs to provide to sense amplifier 38. As will be described in detail below, sense amplifier 38 senses a voltage difference between the bit and bit' signal lines, producing a data signal having a logic level which corresponds to the voltage difference. Memory cell 40 is one of the $2^{m+n}$ memory cells within memory array 32.

FIG. 3 is a block diagram of a metal oxide semiconductor (MOS) memory cell 40 and sense amplifier 38 of FIG. 1. Memory cell 40 includes a pair of cross-coupled inverters 50a–b, forming a latch element having a pair of nodes 52a–b, and a pair of pass transistors 54a–b. Pass transistor 54a selectively couples node 52a of the latch element to the bit signal line, and pass transistor 54b selectively couples node 52b of the latch element to the bit' signal line. Both pass transistors 54a and 54b are controlled by the row select signal, being in a high resistance state (i.e., an "off" state) when the row select signal is deasserted, and being in a low resistance state (i.e., an "on" state) when the row select signal is asserted.

Inverter 50a includes an n-channel transistor 56a coupled between node 52a and a ground potential (i.e., "ground" or "$V_{SS}$") and a load device 58a coupled between node 52a and a positive power supply potential (i.e., "$V_{DD}$"). Similarly, inverter 50b includes an n-channel transistor 56b coupled between node 52b and ground, and a load device 58b coupled between node 52b and $V_{DD}$. Load devices 58a–b provide a current path from $V_{DD}$ to nodes 52a–b, respectively, allowing nodes 52a–b to be "charged" to $V_{DD}$ and to remain at $V_{DD}$ following such charging. Following charging of nodes 52a–b to $V_{DD}$, current from $V_{DD}$ flowing through load devices 58a–b counteracts leakage currents from nodes 52a–b through the transistors connected thereto. Load devices 58a–b thus allow data stored within memory cell 40 to be retained as long as electrical power is supplied (i.e., "static" operation).

Sense amplifier 38 is used during read operations to detect a voltage difference between the bit and bit' signal lines and to produce a data signal having a logic level which corresponds to the voltage difference. Sense amplifier 38 includes a pair of cross-coupled inverters 60a–b, forming a latch element having a pair of nodes 62a–b, a pair of pass transistors 64a–b, and an inverter 66. Pass transistor 64a selectively couples node 62a of the latch element to the bit signal line, and pass transistor 64b selectively couples node 62b of the latch element to the bit' signal line. Both pass transistors 64a and 64b are controlled by a "control" signal, being in a low resistance "on" state when the control signal is deasserted, and being in a high resistance "off" state when the control signal is asserted.

FIG. 4 is a timing diagram illustrating signal timing during the reading of a logic high or "1" from memory cell 40 having functional load devices 58a–b. In this case, transistor 56a of the latch element of memory cell 40 is "off" and node 52a is substantially at $V_{DD}$, and transistor 56b is "on" and node 52b is substantially at ground potential. Prior to or as the first step in a read operation, the bit and bit' signals lines are typically precharged to $V_{DD}$. The row select signal is then asserted, connecting nodes 52a and 52b of the latch element of memory cell 40 to the bit and bit' signal lines, respectively. A relatively large capacitance typically exists between both the bit and bit' signal lines and ground. Transistor 56a is "off", and node 52a of the latch element of memory cell 40 remains at $V_{DD}$. Transistor 56b is "on", and begins to discharge the capacitance of the bit' line. After a delay of time "τ" to allow the difference in the voltage levels of the bit and bit' signals lines ("Vdiff") to reach a desired magnitude, the control signal is asserted, disconnecting node 62a of the latch element from the bit signal line and disconnecting node 62b of the latch element from the bit' signal line. The latch element of sense amplifier 38 changes state to indicate (i.e., "resolve") the corresponding logic value stored within memory element 40. The amount of time t required for this change of state is called the "resolve time" of sense amplifier 38, and is directly dependent upon the magnitude of Vdiff.

Should load devices 58a–b be missing or fail to perform correctly, nodes 52a–b cannot be fully charged to $V_{DD}$. In addition, the leakage currents through the transistors connected to nodes 52a–b eventually cause the voltage at a charged node to drop below a logic level threshold value, causing the data stored within memory cell 40 to be lost. The operation of SRAM device 30 then becomes "dynamic" with a maximum allowable amount of time between write and read operations involving the same memory cell.

Even before data is lost due to charge leakage, the SRAM device may fail to perform correctly due to timing constraints. FIG. 5 is a timing diagram illustrating signal timing during the reading of a logic high or "1" from memory cell 40 having a non-functional load device 58a. As before, transistor 56a of the latch element of memory cell 40 is again "off". In this case, however, the voltage at node 52a is somewhere between ($V_{DD}$-$V_{tn}$) and 0 volts, where $V_{tn}$ is the threshold voltage of pass transistor 54a. The voltage at node 52a is dependent on the capacitance of node 52a, the magnitude of the leakage current from node 52a, and the amount of time since node 52a was charged. Receiving the voltage at node 52a, which is less than $V_{DD}$, transistor 56b is not fully "on". When the row select signal is asserted, node 52a charges to ($V_{DD}$-$V_{tn}$) through transistor 54a. Since node 52a is connected to the gate electrode of transistor 56b and is not at $V_{DD}$, transistor 56b has a higher internal resistance and discharges the capacitance of the bit' line at slower rate than shown in FIG. 4. After delay time τ, the difference in the voltage levels of the bit and bit' signals lines ("Vdiff") is less than Vdiff of FIG. 4. As a result, the "resolve time" of sense amplifier 38 increases to t', where t'>t. If the data signal is sampled before a time interval (τ+t'), the sampled value may be an incorrect value.

Microcontroller core 12 typically enables memory device 14 on a transition (i.e., "edge") of the system clock signal and samples and stores (i.e., latches) the data one or more full clock cycles later. When memory device 14 is an SRAM device, proper operation of the load devices within the memory cells may be tested by increasing the frequency of the system clock signal until the time interval between memory enable and data latch is less than (τ+t'). When this occurs, data retrieved from memory device 14 begins to differ from the data earlier stored within memory device 14.

This technique cannot be used, however, in cases where microcontroller core 12 fails to perform correctly at a system clock frequency below that at which memory device 14 fails to perform correctly (i.e., when memory device 14 is capable of "faster" operation than "slower" microcontroller core 12).

It would thus be desirable to have a microcontroller architecture and associated method which provide for testing of an "on-chip" memory device, wherein such testing does not require increasing the frequency of the system clock signal. Such a microcontroller architecture and method would be particularly useful in testing the functionality of load devices within memory cells of an on-chip SRAM memory device. The desired microcontroller architecture and method would allow a "slower" microcontroller core coupled to a "faster" on-chip memory device to test the functionality of load devices within the memory cells of the memory device.

SUMMARY OF THE INVENTION

The problems outlined above are in large part solved by a microcontroller architecture and an associated method which provide for testing of an "on-chip" memory unit. The microcontroller architecture and method are particularly useful in testing the functionality of load devices within memory cells of the memory unit. The microcontroller is formed upon a single monolithic semiconductor substrate, and includes a microcontroller core, the memory unit, a set of input/output (I/O) pads, and an input/output (I/O) pad interface unit. The microcontroller core executes instructions and generates data. The memory unit is coupled to the microcontroller core and stores the data. In response to a request from the microcontroller core, the memory unit retrieves stored data and provides the retrieved data to the microprocessor core.

The microcontroller includes several features which allow testing of the memory unit, including a data latch within the memory unit for sampling retrieved data and for providing the retrieved data to the microcontroller core. The data latch is responsive to a data latch control signal produced by the I/O pad interface unit. The I/O pad interface unit is coupled to members of the set of I/O pads. The I/O pad interface unit receives a signal from one or more members of the set of I/O pads and generates the data latch control signal in response to the signal.

The memory unit may include, for example, a common static random access memory (SRAM) device having multiple memory cells with at least one load device. The load devices allow the memory device to retain stored data as long as electrical power is applied (i.e., static operation of the memory unit). In one embodiment, the memory unit includes a memory controller coupled between the microcontroller core and the memory device, wherein the memory controller includes the data latch.

As described above, retrieval of the data stored within a common SRAM device involves the assertion of a row select signal. Some time after the row select signal is asserted, the data latch samples and stores (i.e., "latches") the retrieved data. In the present microcontroller architecture, the length of a time period between assertion of the row select signal and the latching of the retrieved data by the data latch is dependent upon the value (i.e., state) of the data latch control signal. In a normal operating mode of the microcontroller, the data latch control signal is deasserted, and the latching of the retrieved data by the data latch occurs a full cycle of a system clock signal following assertion of the row select signal. In a testing mode, the data latch control signal is asserted, and the latching of the retrieved data by the data latch occurs on the next transition of a system clock cycle following assertion of the row select signal. Thus in the testing mode, the length of the time period between assertion of the row select signal and the latching of the retrieved data by the data latch is variable and dependent upon the duty cycle of the system clock signal.

The microcontroller may also include an oscillator circuit for producing the system clock signal. The system clock signal is used to synchronize the operations of the microcontroller core, the memory device, the memory controller, and the I/O pad interface unit. The oscillator circuit may be coupled to a terminal of a semiconductor device package housing the microcontroller, and the oscillator circuit may reproduce a signal driven upon the terminal as the system clock signal.

The present method for testing the memory unit includes providing the microcontroller described above along with a signal generator which generates a periodic pulse train having a selectable duty cycle. The microcontroller is configured (i.e., programmed) to execute a test routine. The test routine includes writing "original" data to one or more of the memory cells within the memory unit, subsequently reading "retrieved" data from the one or more memory cells, and comparing the retrieved data to the original data. The comparing is passed if the retrieved data is the same as the original data, and is failed if the retrieved data is not the same as the original data. The test routine also includes driving a signal indicating whether the comparing is passed or failed upon one or more of the I/O pads.

An output of the signal generator is connected to the terminal of the microcontroller which is in turn connected to the oscillator circuit. The microcontroller is placed in the testing mode by driving a signal upon one or more members of the set of I/O pads in order to cause the I/O pad interface unit to assert the data latch control signal. The following steps are then repeated until the microcontroller indicates the comparing is failed: (i) the duty cycle of the periodic pulse train produced by the signal generator is recorded, (ii) the duty cycle of the periodic pulse train is reduced, and (iii) the microcontroller is directed to perform the test routine. When the microcontroller indicates the comparing is failed, the recorded duty cycle is compared to a predetermined minimum duty cycle. The memory unit passes the testing if the recorded duty cycle is less than or equal to the minimum duty cycle, and the memory unit fails the testing if the recorded duty cycle is greater than the minimum duty cycle.

BRIEF DESCRIPTION OF THE DRAWINGS

Other objects and advantages of the invention will become apparent upon reading the following detailed description and upon reference to the accompanying drawings in which.

Figure 1:
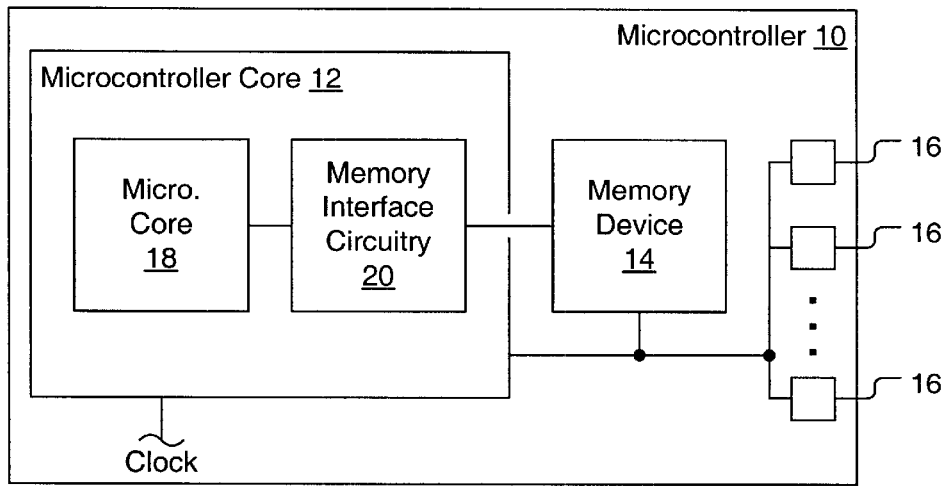
FIG. 1 is a block diagram of an exemplary microcontroller including a microcontroller core coupled to an "on-chip" memory device and to several input/output (I/O) pads.
Figure 2:
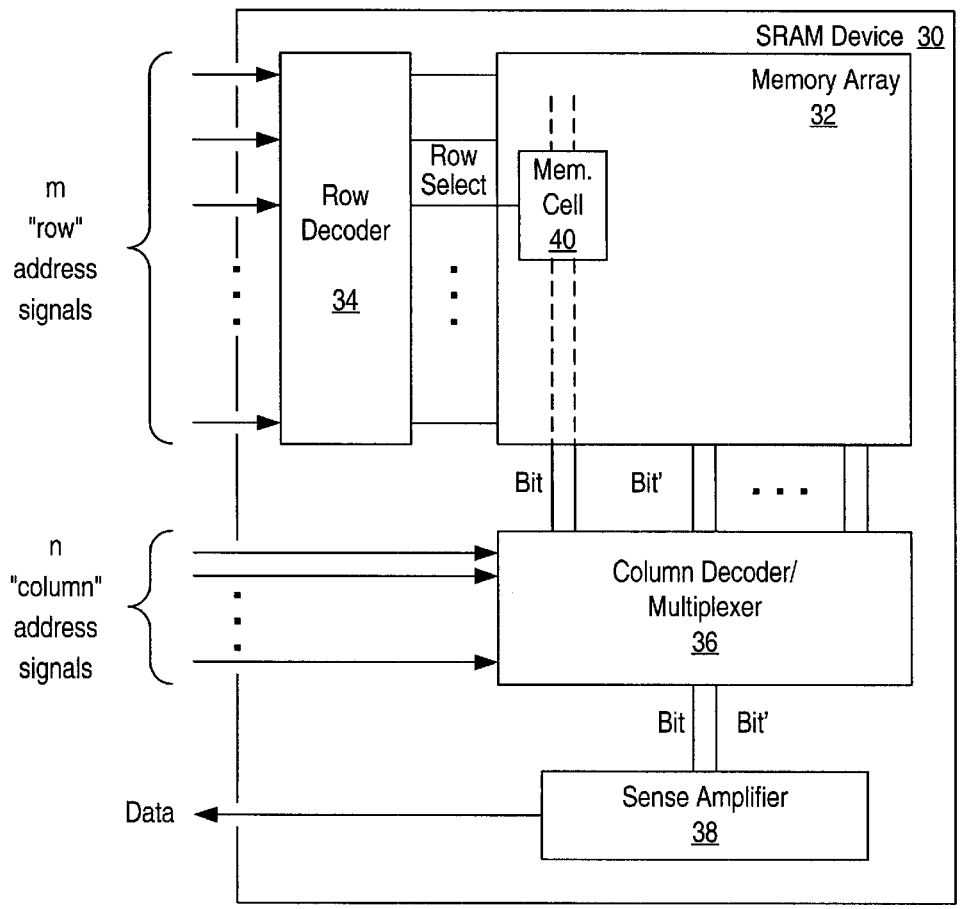
FIG. 2 is a block diagram of a typical SRAM device including a memory array, a row decoder, a column decoder/multiplexer, and a sense amplifier, wherein the memory array includes an array of memory cells.
Figure 3:
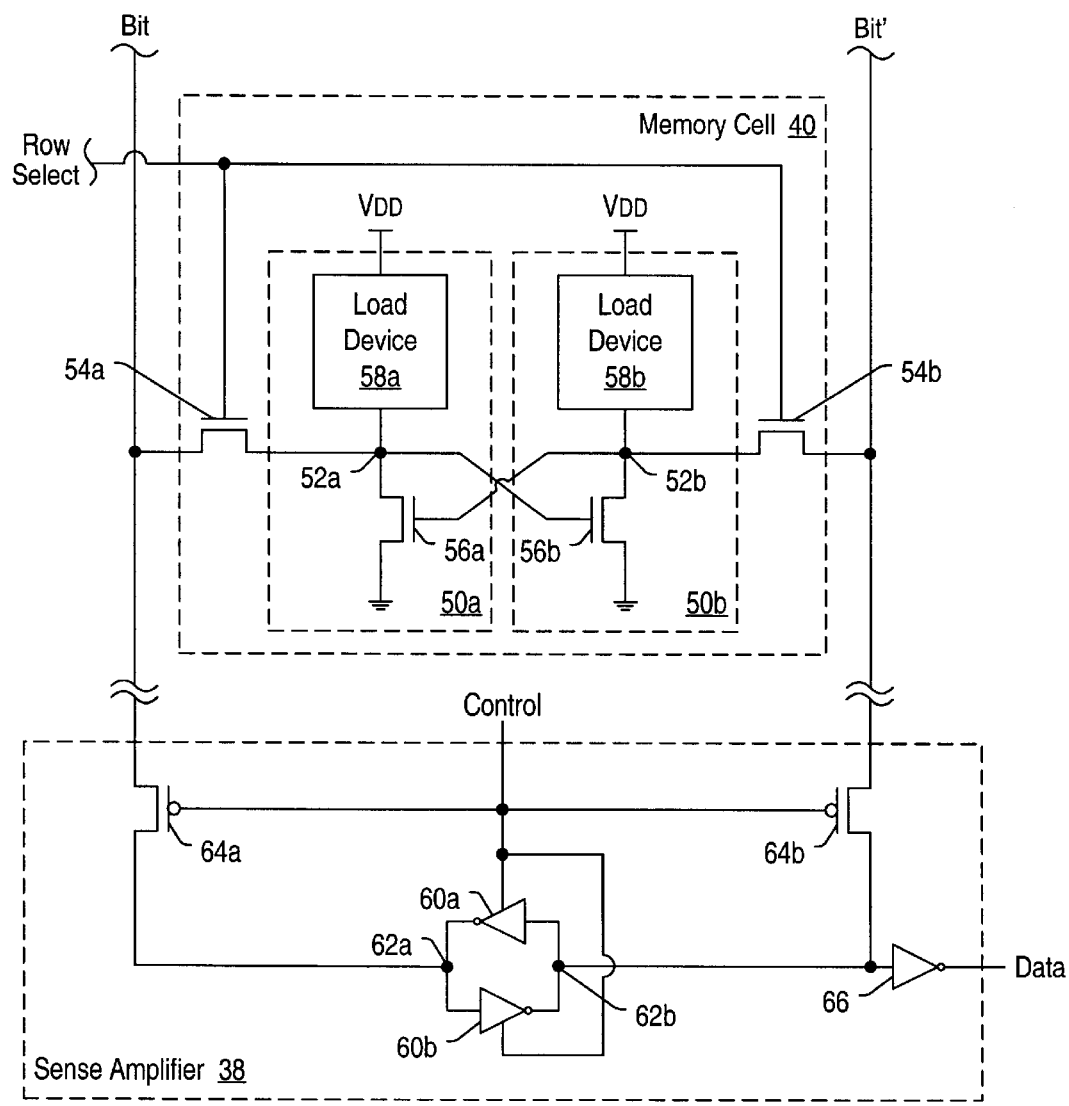
FIG. 3 is a block diagram of a metal oxide semiconductor (MOS) memory cell and sense amplifier of the SRAM device of FIG. 2, wherein the memory cell includes a pair of cross-coupled inverters forming a latch element, and wherein each inverter includes a load device.
Figure 4:
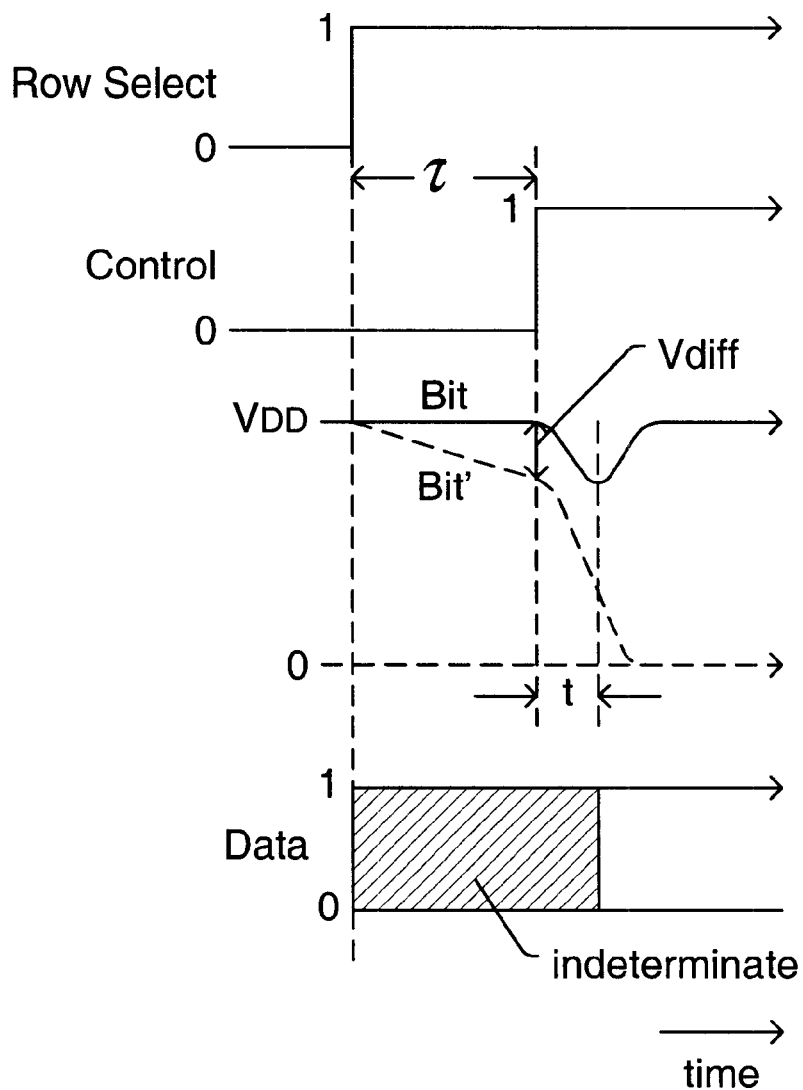
FIG. 4 is a timing diagram illustrating signal timing during the reading of a logic high or "1" from the memory cell of FIG. 3 wherein both load devices are functional.
Figure 5:
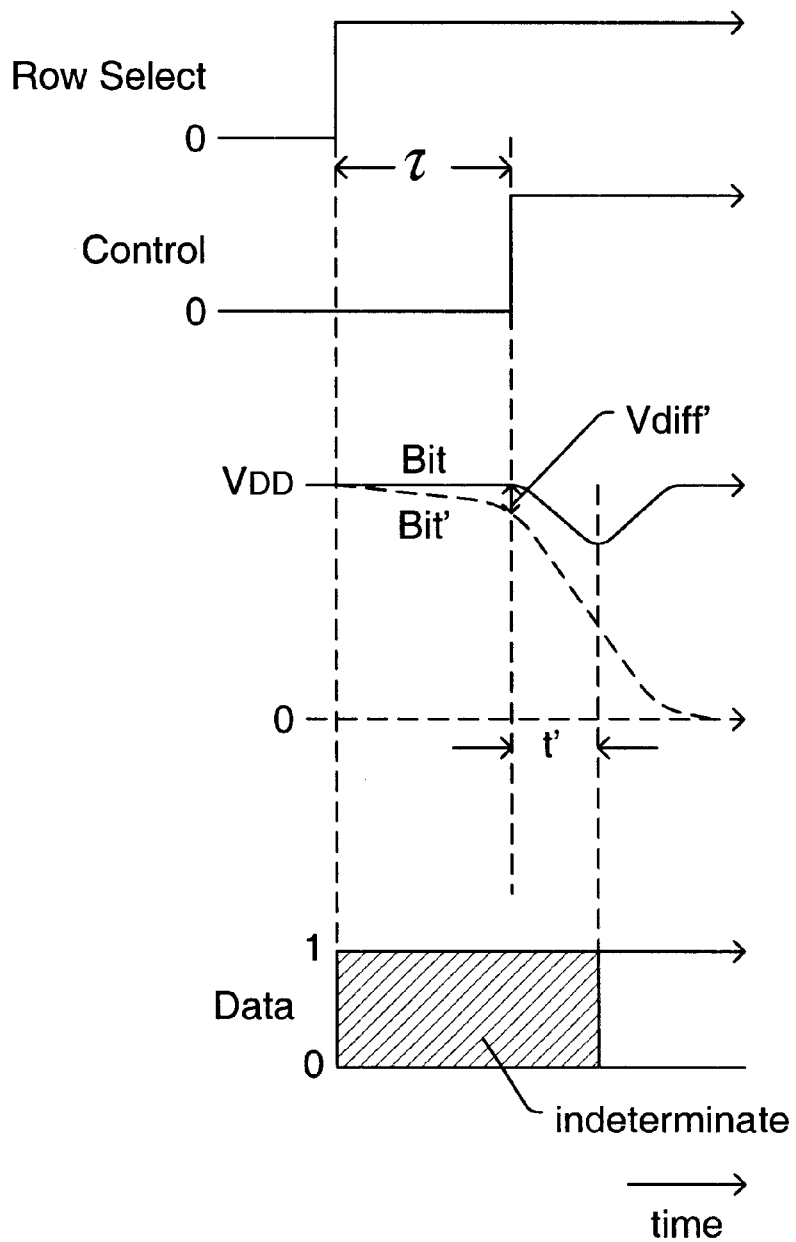
FIG. 5 is a timing diagram illustrating signal timing during the reading of a logic high or "1" from the memory cell of FIG. 3 wherein at least one of the load devices is non-functional.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 6:
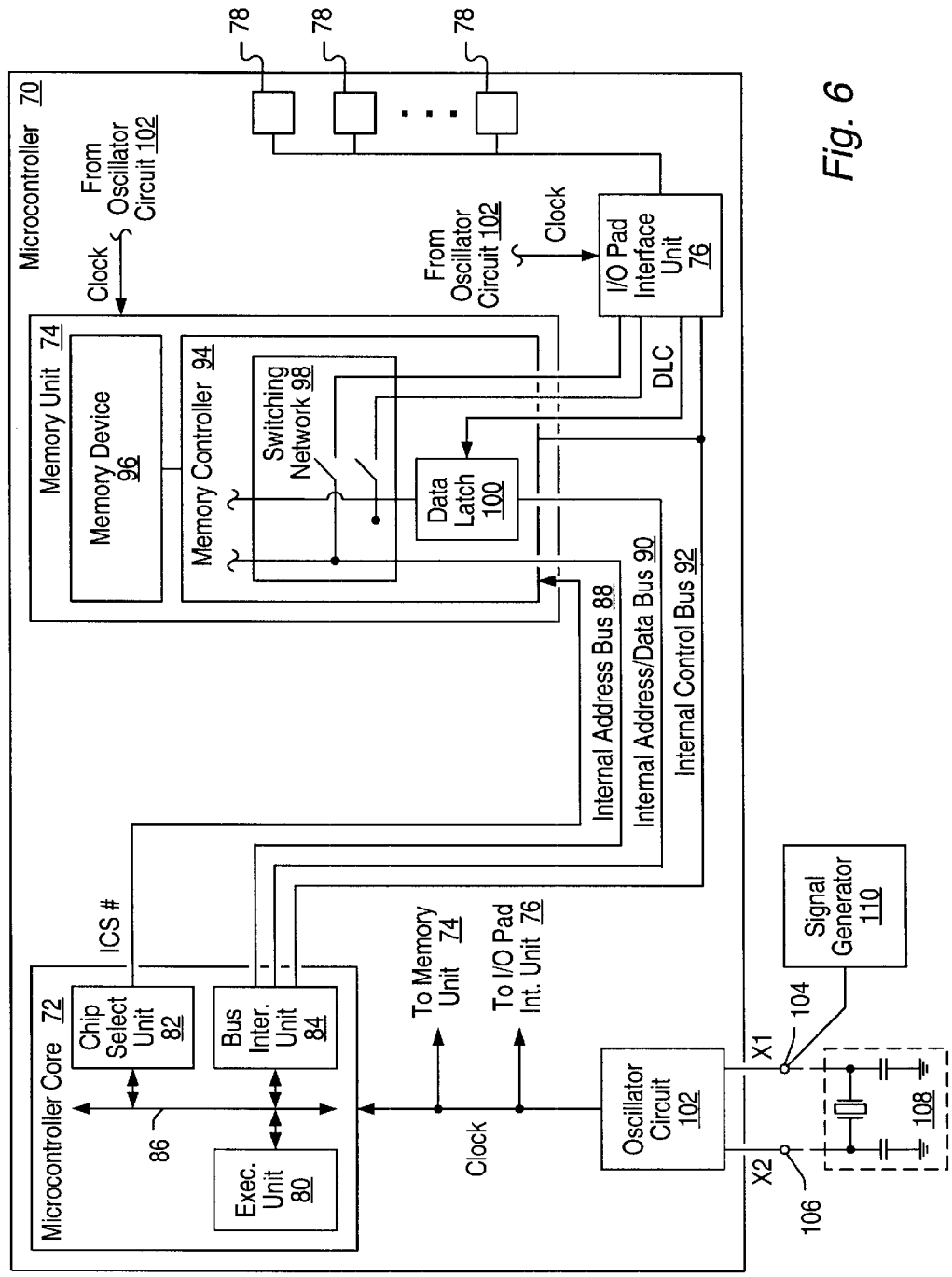
FIG. 6 is a block diagram of one embodiment of a microcontroller in accordance with the present invention, wherein the microcontroller includes a memory unit having a data latch responsive to a data latch control (DLC) signal.

FIG. 6 is a block diagram of one embodiment of a microcontroller 70 in accordance with the present invention. Microcontroller 70 includes a microcontroller core 72, an memory unit 74, an input/output (I/O) pad interface unit 76, and I/O pads 78 all on a single monolithic semiconductor substrate (i.e., chip). Microcontroller core 72 includes an execution unit 80, a chip select unit 82, and a bus interface unit 84 coupled to a core bus 86. Execution unit 80 executes microprocessor instructions, preferably from an instruction set of an x86 microprocessor. Execution unit 80, chip select unit 82, and bus interface unit 84 communicate via signals driven upon signal lines of core bus 86.

Chip select unit 82 is configured to produce an internal chip select (ICS#) signal. (Signal names followed by "#" are active low, meaning the signal is active or asserted when the signal voltage corresponds to that of a low logic level). The ICS# signal is a dedicated internal signal which provides an enable signal for memory unit 74. When asserted, signal ICS# enables data storage operations within memory unit 74. Bus interface unit 84 handles all data transfers between microcontroller core 72 and memory unit 74, and between microcontroller core 72 and external (i.e., "off-chip") memory and I/O devices.

In the embodiment of FIG. 1, bus interface unit 84 is coupled to three internal buses: an internal address bus 88, an internal address/data bus 90, and an internal control bus 92. Internal address bus 88 includes multiple signal lines, and each signal line is configured to carry an address signal. Internal address/data bus 90 is a common multiplexed address/data bus. Internal address/data bus 90 includes multiple signal lines, and each signal line is configured to carry an address signal during certain time intervals and a data signal during other time intervals. Such multiplexed buses are used to reduce the total number of required signal lines. Internal control bus 92 includes multiple signal lines, and each signal line is configured to carry a control signal. Bus interface unit 84 contains multiple data buffers and is configured to generate and drive address, data, and control signals onto internal address bus 88, internal address/data bus 90, and internal control bus 92, respectively, in accordance with established protocols in order to accomplish data transfers.

Memory unit 74 is configured to store data, and includes a memory controller 94 coupled to a memory device 96. Memory controller 94 is coupled to receive the ICS# signal produced by chip select unit 82, and is also coupled to signal lines of internal address bus 88, internal address/data bus 90, and internal control bus 92. Memory device 96 may include, for example, multiple static random access memory (SRAM) storage locations (i.e., memory cells). Assertion of the ICS# signal enables storage operations within memory unit 14. Memory controller 94 generates and issues control signals to memory device 96 required to save data within memory device 96 and to retrieve data from memory device 96.

Memory controller 94 includes a switching network 98. Switching network 98 allows microcontroller 70 to selectively drive address and data signals associated with memory unit 74 onto I/O pads 78. Such "visibility" of address and data signals associated with memory unit 74 is important during testing of microcontroller 70.

Memory controller 94 also includes a data latch 100. During reads from memory device 96, data latch 100 samples and stores (i.e., latches) data provided by memory device 96 and provides the data to microcontroller core 72 via internal address/data bus 90. In accordance with the present invention, the timing of the latching action performed by data latch 100 is dictated by the logic value (i.e., state) of a data latch control (DLC) signal produced by I/O pad interface unit 76. Data latch 100 receives the DLC signal and the system clock signal. When the DLC signal is deasserted, data latch 100 latches the data provided by memory device 96 a full cycle of the system clock signal after the row select signal is asserted. The DLC signal is deasserted in a normal operating mode of microcontroller 70.

In the normal operating mode, the time between the assertion of the row select signal and the latching of the data produced by memory device 96 can only be reduced by increasing the frequency of the system clock signal. The normal operating mode is not conducive to testing of the functionality of load devices within the memory cells of memory device 96 using microcontroller core 72 in cases where microcontroller core 72 is "slower" than memory unit 74. In such cases, microcontroller core 72 may fail to operate correctly at a system clock frequency below that required to test of the functionality of the load devices.

When the DLC signal is asserted, data latch 100 latches the data provided by memory device 96 on the next transition of the system clock signal after the row select signal is asserted. The DLC signal is asserted in a testing mode of microcontroller 70. In the testing mode, the time between the assertion of the row select signal and the latching of the data produced by memory device 96 can be reduced by reducing the ratio of the amount of time the system clock signal is asserted to the period of the system clock signal (i.e., by reducing the duty cycle of the system clock signal). As the testing mode does not require that the frequency of the system clock signal be increased, the testing mode allows testing of the functionality of load devices within the memory cells of memory device 96 using microcontroller core 72 in cases where microcontroller core 72 is "slower" than memory unit 74.

I/O pads 78 are flat metal contact regions located upon an exposed surface of the chip. During manufacture of microcontroller 70, signal lines to be connected to external devices are terminated at I/O pads 78. Following manufacture, microcontroller 70 is typically secured within a protective semiconductor device package. Each I/O pad 78 is then connected to a terminal (e.g., a pin) of the device package by a signal line (i.e., a wire).

I/O pad interface unit 76 is coupled between internal signal lines of microcontroller 70 and I/O pads 78. I/O pad interface unit 76 contains driver circuitry to drive voltage levels on I/O pads 78 which correspond to voltage levels on associated internal signal lines (i.e., drive signals present on internal signal lines onto corresponding I/O pads 78). I/O pad interface unit 76 also contains driver circuitry to drive signals present on I/O pads 78 onto corresponding internal signal lines. In addition, I/O pad interface unit 76 contains logic circuitry to latch some internal signals prior to driving them onto corresponding I/O pads 78. For example, I/O pad interface unit 76 drives signals present on the signal lines of internal address bus 88 onto corresponding I/O pads 78. I/O pad interface unit 76 also drives signals present on the signal lines of internal address/data bus 90 onto corresponding I/O pads 78 during certain time intervals, and drives signals present on the corresponding I/O pads 78 onto corresponding signal lines of internal address/data bus 90 during other time intervals. I/O pad interface unit 76 also drives output control signals present on certain signal lines of internal control bus 92 onto corresponding I/O pads 78, and drives input control signals present on I/O pads 78 onto corresponding signal lines of internal control bus 92. As will be described in detail below, I/O pad interface unit 76 also includes circuitry which generates the DLC signal and provides the DLC signal to memory unit 74.

Microcontroller 70 also includes an oscillator circuit 102 which produces a system "clock" signal. The clock signal is used to synchronize all activities within microcontroller 70. Oscillator circuit 102 is connected to two terminals of the device package containing microcontroller 70: an "X1" terminal 104 and an "X2" terminal 106. During normal operation, a "tank" circuit 108 including a crystal and two capacitors are used to generate the clock signal.

During testing in according with the present invention, a signal generator 110 is used to generate a periodic pulse train wherein the pulses are substantially rectangular and the ratio of the duration of the pulses to the period of the pulse train (i.e., the duty cycle of the pulse train) is variable. The pulse train is coupled to X1 terminal 104 of oscillator circuit 102, and X2 terminal 106 is left unconnected (i.e., "floated"). In this configuration, oscillator circuit 102 replicates the pulse train produced by signal generator 110 as the system clock signal.

Figure 7:
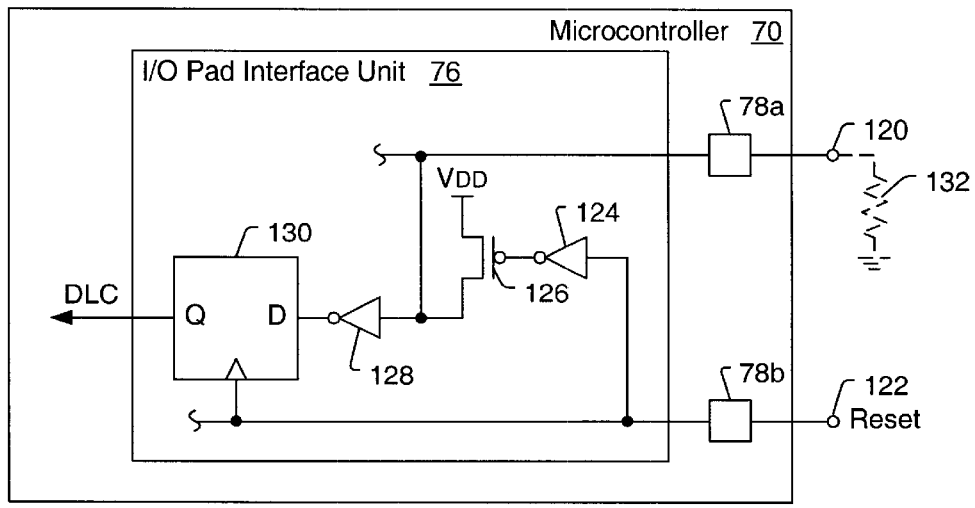
FIG. 7 is a block diagram of one embodiment of circuitry within the I/O pad interface unit for generating the DLC signal.

FIG. 7 is a block diagram of one embodiment of circuitry within I/O pad interface unit 76 for generating the DLC signal. A first I/O pad 78a is coupled to a terminal 120 of the device package containing microcontroller 70. Terminal 120 may be any terminal which has no functionality (i.e., is not driven) when a "reset" signal is asserted. A second I/O pad 78b is coupled to a terminal 122 which receives the externally-generated reset signal. The circuitry within I/O pad interface unit 76 for generating the DLC signal includes a first inverter 124, a p-channel MOS transistor 126, an second inverter 128, and a D flip-flop 130.

A resistor 132 is connected between terminal 120 and ground to initiate the testing mode. The resistance of resistor 132 is chosen to be below an expected input impedance of any external circuitry connected to terminal 120. Transistor 126 is connected between $V_{DD}$ and an input terminal of inverter 128. Transistor 126 functions as a "weak" pull-up device having an "on" resistance many times that of resistor 132. Terminal 122 receives the reset signal, and is connected to an input terminal of inverter 124 and to a clock input terminal of D flip-flop 130 via I/O pad 78b. An output terminal of inverter 128 is connected to a D input terminal of D flip-flop 130, and a Q output terminal of D flip-flop 130 produces the DLC signal. The input terminal of inverter 128 is also connected to terminal 120 via I/O pad 78a. When resistor 132 is connected between terminal 120 and ground, inverter 128 produces a voltage substantially equal to $V_{DD}$ (i.e., a logic "1") at an output terminal. When resistor 132 is not connected between terminal 120 and ground, inverter 128 produces a voltage substantially equal to the ground potential (i.e., a logic "0") at the output terminal.

Assertion of the reset signal causes D flip-flop 130 to sample and store the output of inverter 128, reproducing the output of inverter 128 at the Q output terminal. When resistor 132 is connected between terminal 120 and ground and the reset signal is asserted, the DLC signal produced at the Q output terminal of D flip-flop 130 is substantially equal to $V_{DD}$ (i.e., a logic "1"). The asserted DLC signal causes microcontroller 70 to enter the testing mode. On the other hand, when resistor 132 is not connected between terminal 120 and ground and the reset signal is asserted, the DLC signal produced at the Q output terminal of D flip-flop 130 is substantially equal to the ground potential (i.e., a logic "0"). The deasserted DLC signal causes microcontroller 70 to enter the normal operating mode.

Figure 8:
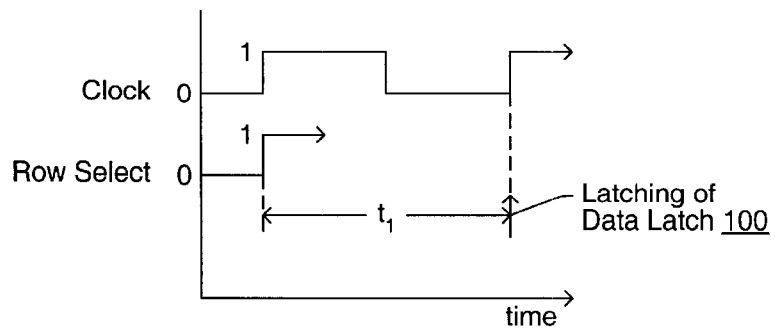
FIG. 8 is a timing diagram illustrating the timing relationships between a system clock signal, a row select signal, and sampling and storing (i.e., latching) of retrieved data by the data latch when the DLC signal is deasserted and the microcontroller is in a normal operating mode.

FIG. 8 is a timing diagram illustrating the timing relationships between the system clock signal, the row select signal, and the latching of data latch 100 when the DLC signal is deasserted and microcontroller 70 is in the normal operating mode. The row select signal is asserted on a rising edge of the clock signal, and the latching of data latch 100 occurs a full clock cycle later on the next rising edge of the clock signal. A time period $t_l$ between assertion of the row select signal and the latching of data latch 100 is equal to the period of the clock signal, and is only decreased by increasing the frequency of the clock signal. As described above, increasing the frequency of the clock signal in order to test load devices within memory device 96 of memory unit 74 may not be effective when microcontroller core 72 is "slower" than memory unit 74.

Figure 9:
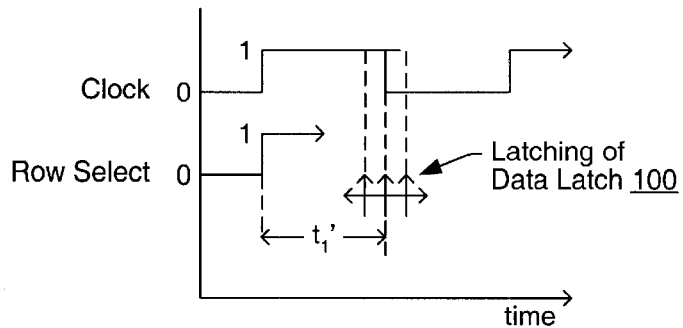
FIG. 9 is a timing diagram illustrating the timing relationships between the system clock signal, the row select signal, and the latching of retrieved data by the data latch when the DLC signal is asserted and the microcontroller is in a testing mode.

FIG. 9 is a timing diagram illustrating the timing relationships between the system clock signal, the row select signal, and the latching of data latch 100 when the DLC signal is asserted and microcontroller 70 is in the testing mode. The latching of data latch 100 occurs on a falling edge of the clock signal following assertion of the row select signal on the preceding rising edge. A time period $t_l'$ between assertion of the row select signal and the latching of data latch 100 is varied by varying the duty cycle of the clock signal. Specifically, time period $t_l'$ is increased by increasing the duty cycle of the clock signal, and decreased by decreasing the duty cycle of the clock signal. As described above, decreasing time $t_l'$ in order to test the load devices within memory device 96 of memory unit 74 is effective when memory unit 74 is "faster" than microcontroller core 72.

In accordance with the present invention, proper operation of the load devices within the memory cells of memory device 96 of "on-chip" memory unit 74 of microcontroller 70 may be tested using the following steps. Microcontroller 70 is configured to write "original" data to one or more memory cells (i.e., addresses) within memory device 96 of memory unit 74, to subsequently read "retrieved" data from the one or more memory cells, to compare the retrieved data to the original data. If the retrieved data is the same as (i.e., matches) the original data, the comparison operation is passed. If the retrieved data differs from the original data, the comparison operation is failed. Microcontroller 70 is also configured to indicate whether the comparison operation is passed or failed by driving one or more predetermined signals upon I/O pads 78.

Signal generator 110, configured to produce a periodic pulse train wherein the ratio of the duration of the pulses to the period of the pulse train (i.e., the duty cycle of the pulse train) is variable, is connected to X1 terminal 104. Microcontroller 70 is then placed in the testing mode by driving a signal upon one or more I/O pads 78 in order to cause I/O pad interface unit 76 to assert the data latch control signal. A starting duty cycle is established. The following steps are repeated until the comparison operation fails: (i) the duty cycle of the pulse train is recorded, (ii) the duty cycle is decreased, and (iii) the write, read, comparison, and pass/fail indication operations of microcontroller 70 are initiated. When the retrieved data does not match the original data due to timing constraints within memory unit 74, the comparison operation fails.

When microcontroller 70 indicates the comparison operation fails, the recorded duty cycle is compared to a predetermined minimum duty cycle. If the recorded duty cycle is less than or equal to the minimum duty cycle, all of the load devices within memory device 96 of memory unit 74 are operating correctly, and memory unit 74 of microcontroller 70 passes the test. If the recorded duty cycle is greater than the minimum duty cycle, one or more of the load devices within memory device 96 of memory unit 74 may not be operating correctly, and memory unit 74 of microcontroller 70 fails the test.

It will be appreciated by those skilled in the art having the benefit of this disclosure that this invention is believed to be a microcontroller architecture and an associated method which provide for testing of an "on-chip" memory unit. It is intended that the following claims be interpreted to embrace all such modifications and changes and, accordingly, the specification and drawings are to be regarded in an illustrative rather than a restrictive sense.

What is claimed is:

1. An apparatus for testing a microcontroller embodying memory, comprising:
    a clocking input coupled to the microcontroller and adapted to receive a system clock; and
    a data latch operably coupled to the clocking input for latching data from the memory during a second transition of the system clock immediately following a first transition upon which a row of memory cells within the memory is selected.

2. The apparatus as recited in claim 1, wherein a difference between the first and second transitions is substantially equal to a time needed to test the memory unit.

3. The apparatus as recited in claim 1, wherein a difference between the first and second transitions is less than a cycle time of the system clock.

4. The apparatus as recited in claim 1, wherein a time difference between the first and second transitions is variable and dependent on a variable duty cycle of the system clock.

5. The apparatus as recited in claim 1, wherein the microcontroller is clocked at substantially each cycle of the system clock, and wherein the row of memory cells, followed by the data latch, are clocked in combination at substantially each transition of the system clock during testing of the memory.

6. A microcontroller formed upon a single monolithic semiconductor substrate, comprising:

a microcontroller core configured to execute instructions and to generate data;

a memory unit coupled to the microcontroller core and configured to store the data and to subsequently retrieve the stored data, and wherein the memory unit includes a data latch for sampling retrieved data and for providing the retrieved data to the microcontroller core, and wherein the data latch is responsive to a data latch control signal; and an input/output (I/O) pad interface unit coupled to one or more I/O pads and configured to receive a signal from each of the one or more I/O pads and to generate the data latch control signal in response to the signal.

7. The microcontroller as recited in claim 6, wherein the memory unit includes a plurality of memory cells each having at least one load device, and wherein the load devices permit static operation of the memory unit.

8. The microcontroller as recited in claim 6, wherein retrieval of the data stored within the memory unit involves the assertion of a row select signal.

9. The microcontroller as recited in claim 8, wherein when the data latch control signal is deasserted, the sampling of the retrieved data by the data latch occurs a full cycle of a system clock signal following assertion of the row select signal.

10. The microcontroller as recited in claim 8, wherein when the data latch control signal is asserted, the sampling of the retrieved data by the data latch occurs on the next transition of a system clock cycle following assertion of the row select signal.

11. The microcontroller as recited in claim 10, wherein the length of a time period between assertion of the row select signal and the sampling of the retrieved data by the data latch is variable and dependent upon the duty cycle of the system clock signal.

12. The microcontroller as recited in claim 6, wherein the memory unit comprises:

a memory device including the plurality of memory cells; and a memory controller coupled between the microcontroller core and the memory device, wherein the memory controller includes the data latch.

13. The microcontroller as recited in claim 6, further comprising an oscillator circuit for producing a system clock signal, wherein the system clock signal is used to synchronize the operations of the microcontroller core, the memory device, the memory controller, and the I/O pad interface unit.

14. The microcontroller as recited in claim 13, wherein the oscillator circuit is coupled to a terminal and configured to reproduce a signal driven upon the terminal as the system clock signal.

15. A microcontroller formed upon a single monolithic semiconductor substrate, comprising:

a microcontroller core configured to execute instructions and to generate data;

a memory device configured to store the data and to subsequently retrieve the stored data, wherein the memory device includes a plurality of memory cells each having at least one load device, and wherein the load devices permit static operation of the memory device;

a memory controller coupled between the memory device and the microcontroller core, wherein the memory controller includes a data latch for sampling retrieved data and for providing the retrieved data to the microcontroller core, and wherein the data latch is responsive to a data latch control signal;

a set of input/output (I/O) pads;

an I/O pad interface unit coupled to the set of I/O pads and configured to receive a signal from one or more members of the set of I/O pads and to generate the data latch control signal in response to the signal; and an oscillator circuit for producing a system clock signal, wherein the system clock signal is used to synchronize the operations of the microcontroller core, the memory device, the memory controller, and the I/O pad interface unit, and wherein the oscillator circuit is coupled to a terminal and configured to reproduce a signal driven upon the terminal as the system clock signal.

16. The microcontroller as recited in claim 15, wherein retrieval of the data stored within the memory unit involves the assertion of a row select signal.

17. The microcontroller as recited in claim 16, wherein when the data latch control signal is deasserted, the sampling of the retrieved data by the data latch occurs a full cycle of the system clock signal following assertion of the row select signal.

18. The microcontroller as recited in claim 16, wherein when the data latch control signal is asserted, the sampling of the retrieved data by the data latch occurs on the next transition of the system clock cycle following assertion of the row select signal.

19. The microcontroller as recited in claim 18, wherein the length of a time period between assertion of the row select signal and the sampling of the retrieved data by the data latch is variable and dependent upon the duty cycle of the system clock signal.

20. A method for testing a memory embodied upon a monolithic substrate containing a microcontroller, comprising latching data from the memory less than one clock cycle after which a row select signal is asserted to the memory.

21. The method as recited in claim 20, wherein said latching comprises retrieving data from the memory at a second transition of a system clock which, during an immediately preceding first transition, synchronized assertion of the row select signal.

22. The method as recited in claim 21, wherein a time separating the first and second transitions is variable and less than a difference in system clock transitions used to synchronize activities of the microcontroller.

23. The method as recited in claim 22, wherein the difference in system clock transitions is approximately equal to a cycle of the system clock.

24. The method as recited in claim 22, wherein the time separating the first and second transitions is lessened until said latching of data received from the memory is dissimilar from data stored therein.

25. The method as recited in claim 20, wherein said latching of data selectively occurs through user input to the monolithic substrate.

* * * * *